United States Patent
Xie et al.

(10) Patent No.: US 10,950,692 B2
(45) Date of Patent: Mar. 16, 2021

(54) METHODS OF FORMING AIR GAPS BETWEEN SOURCE/DRAIN CONTACTS AND THE RESULTING DEVICES

(71) Applicant: GLOBALFOUNDRIES U.S. Inc., Santa Clara, CA (US)

(72) Inventors: Ruilong Xie, Niskayuna, NY (US); Vimal Kamineni, Mechanicville, NY (US); Shesh Mani Pandey, Saratoga Springs, NY (US); Hui Zang, Guilderland, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/121,058

(22) Filed: Sep. 4, 2018

(65) Prior Publication Data

US 2020/0075715 A1    Mar. 5, 2020

(51) Int. Cl.
| | | |
|---|---|---|
| *H01L 23/532* | (2006.01) | |
| *H01L 29/06* | (2006.01) | |
| *H01L 27/088* | (2006.01) | |
| *H01L 21/768* | (2006.01) | |
| *H01L 21/764* | (2006.01) | |
| *H01L 21/8234* | (2006.01) | |

(52) U.S. Cl.
CPC ........ *H01L 29/0653* (2013.01); *H01L 21/764* (2013.01); *H01L 21/76897* (2013.01); *H01L 21/823431* (2013.01); *H01L 27/0886* (2013.01)

(58) Field of Classification Search
None
See application file for complete search history.

(56) References Cited

U.S. PATENT DOCUMENTS

| | | | |
|---|---|---|---|
| 5,869,379 A | 2/1999 | Gardner et al. | |
| 7,666,753 B2 | 2/2010 | Bonilla et al. | |
| 7,741,663 B2 | 6/2010 | Hause et al. | |
| 8,390,079 B2* | 3/2013 | Horak ............... | H01L 29/66545 257/401 |
| 8,637,384 B2* | 1/2014 | Ando ..................... | H01L 29/785 438/479 |
| 9,735,246 B1 | 8/2017 | Basker et al. | |
| 2015/0243544 A1 | 8/2015 | Alptekin et al. | |
| 2018/0033863 A1 | 2/2018 | Xie et al. | |
| 2018/0090593 A1* | 3/2018 | Cheng ............... | H01L 21/30604 |
| 2018/0138279 A1* | 5/2018 | Xie ..................... | H01L 29/4991 |
| 2019/0221563 A1* | 7/2019 | Choi .................... | H01L 21/762 |

* cited by examiner

*Primary Examiner* — Long Pham
(74) *Attorney, Agent, or Firm* — David Cain; Hoffman Warnick LLC

(57) ABSTRACT

One device disclosed herein includes, among other things, first and second active regions, a first source/drain contact positioned above the first active region, a second source/drain contact positioned above the second active region, and a dielectric material disposed between the first and second source/drain contacts, wherein the dielectric material defines an air gap cavity positioned between the first and second source/drain contacts.

19 Claims, 9 Drawing Sheets

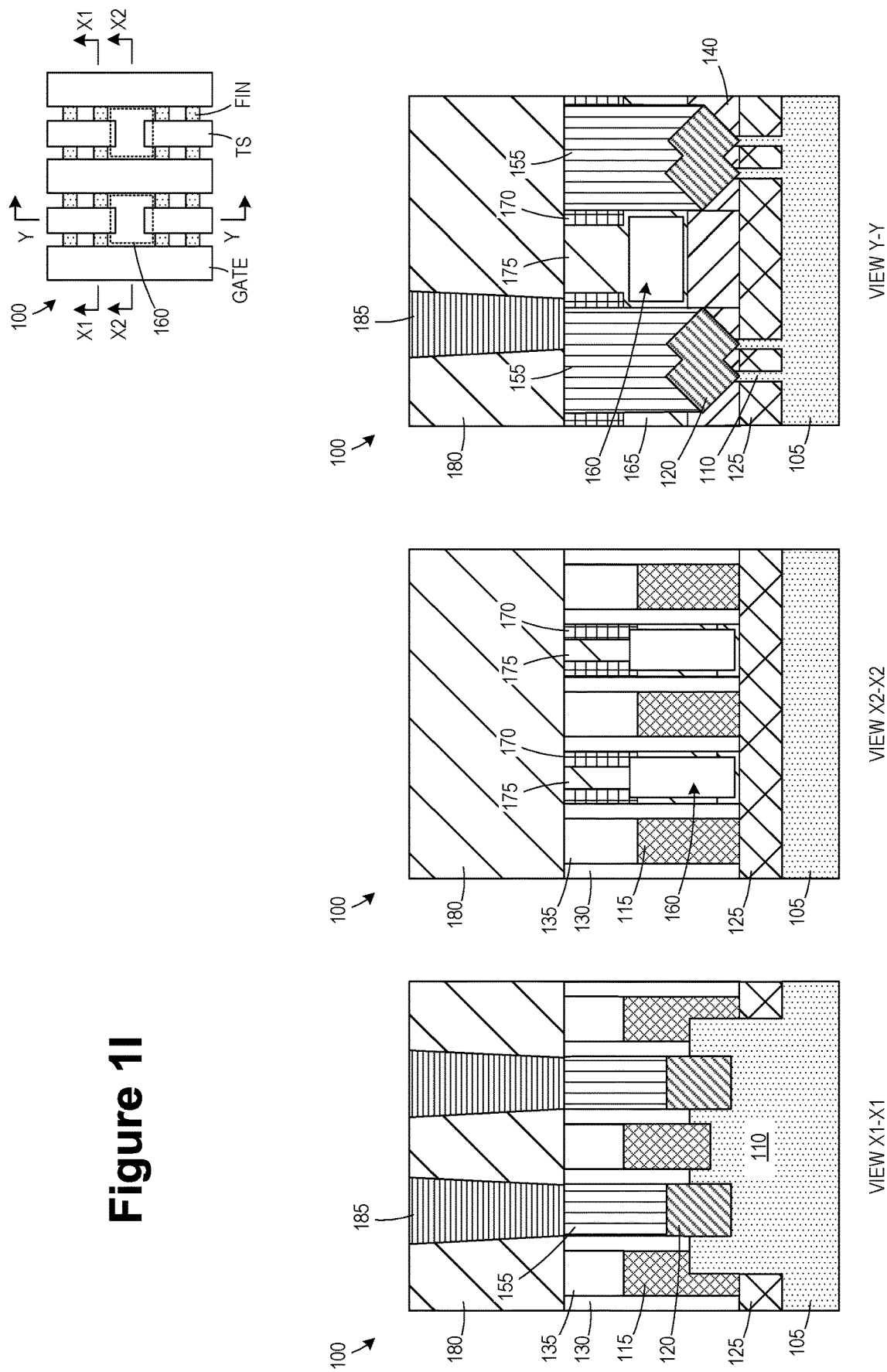

METHODS OF FORMING AIR GAPS BETWEEN SOURCE/DRAIN CONTACTS AND THE RESULTING DEVICES

BACKGROUND

1. Field of the Disclosure

The present disclosure generally relates to the fabrication of integrated circuits, and, more particularly, to various methods of forming air gaps between source/drain contacts and the resulting devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time.

The operating speed of FETs is also affected by the dielectric materials employed to separate the various elements of the FET. The dielectric material affects the parasitic capacitance present between the adjacent elements, such as the parasitic capacitance between a gate electrode and a source/drain contact or the parasitic capacitance between two adjacent source/drain contacts. Increased parasitic capacitance reduces the operating speed of the devices.

SUMMARY

The present disclosure is directed to various methods of forming air gaps between source/drain contacts and the resulting devices that may avoid, or at least reduce, the effects of one or more of the problems identified above. The following presents a simplified summary of the disclosure to provide a basic understanding of some aspects of the embodiments. This summary is not an exhaustive overview of the embodiments. It is not intended to identify key or critical elements of the embodiments or to delineate the scope of the embodiments. Its sole purpose is to present some concepts in a simplified form as a prelude to the more detailed description that is discussed later.

One illustrative device disclosed includes, among other things, first and second active regions, a first source/drain contact positioned above the first active region, a second source/drain contact positioned above the second active region, and a dielectric material disposed between the first and second source/drain contacts, wherein the dielectric material defines an air gap cavity positioned between the first and second source/drain contacts.

Another device includes, among other things, first and second active regions, first and second gate structures formed above the first and second active regions, a first source/drain contact positioned above the first active region between the first and second gate structures, a second source/drain contact positioned above the second active region between the first and second gate structures, and a dielectric material disposed between the first and second source/drain contacts, wherein the dielectric material defines an air gap cavity positioned between the first and second source/drain contacts and between the first and second gate structures.

One illustrative method disclosed includes, among other things, forming first and second active regions in a semiconductor substrate, forming a first source/drain contact positioned above the first active region, forming a second source/drain contact positioned above the second active region, and forming a dielectric material between the first and second source/drain contacts, wherein the dielectric material defines an air gap cavity positioned between the first and second source/drain contacts.

BRIEF DESCRIPTION OF THE DRAWINGS

The disclosure may be understood by reference to the following description taken in conjunction with the accompanying drawings, in which like reference numerals identify like elements, and in which:

FIGS. 1A-1I depict various novel methods disclosed herein for methods of forming air gaps between source/drain contacts and the resulting devices.

Figure 1A:
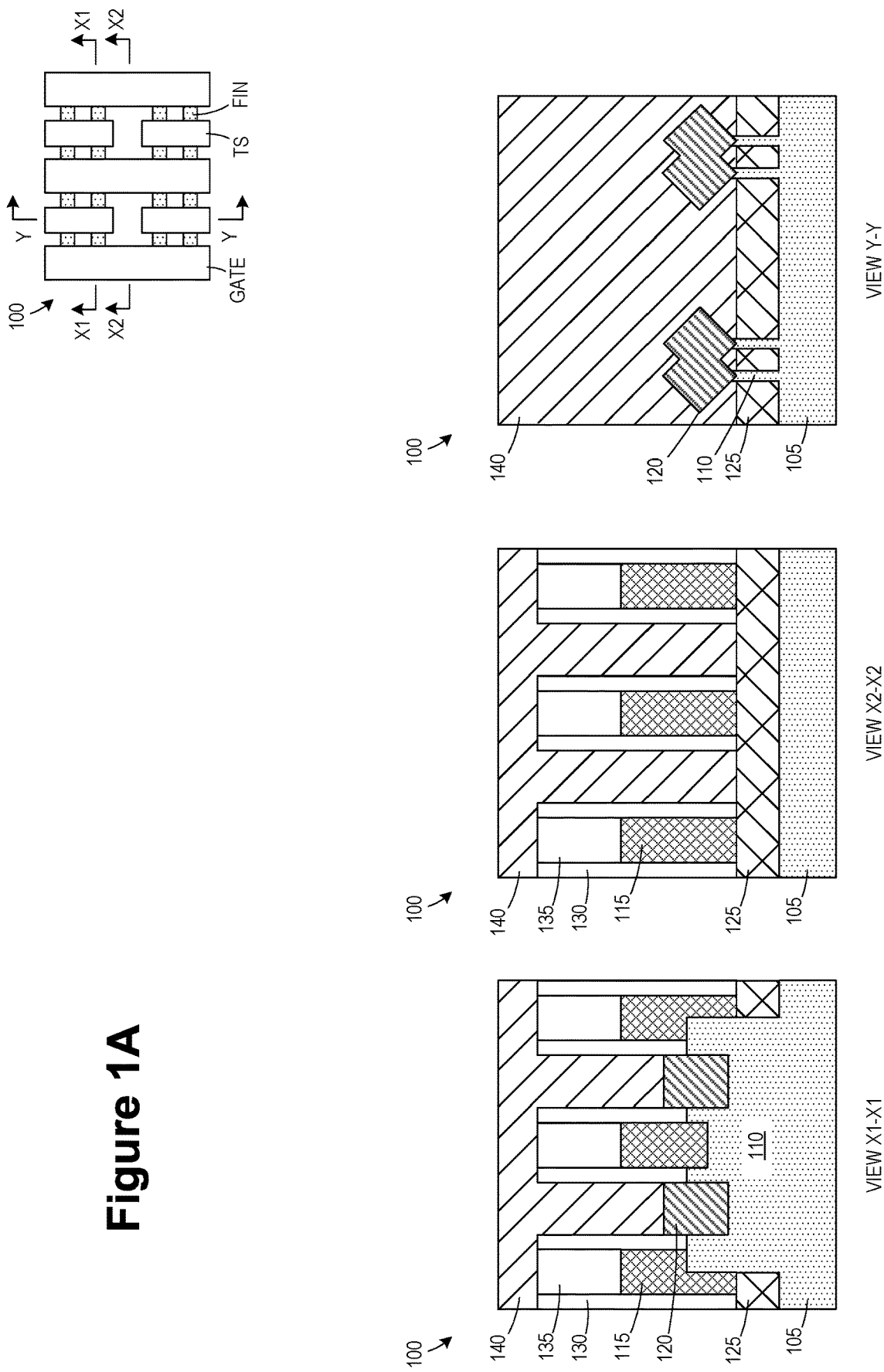

While the subject matter disclosed herein is susceptible to various modifications and alternative forms, specific embodiments thereof have been shown by way of example in the drawings and are herein described in detail. It should be understood, however, that the description herein of specific embodiments is not intended to limit the embodiments to the particular forms disclosed, but on the contrary, the intention is to cover all modifications, equivalents, and alternatives falling within the spirit and scope of the embodiments as defined by the appended claims.

DETAILED DESCRIPTION

Various illustrative embodiments of the embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming air gaps between source/drain contacts and the resulting devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the embodiments disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed embodiments should not be considered to be limited to any particular form of transistors or the manner in which the gate structures of the transistor devices are formed. Of course, the embodiments disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1A-1I depict various novel methods of forming air gaps between source/drain contacts formed on an integrated circuit (IC) product 100. The figures contain a simplistic plan view showing where various cross-sectional views are taken in the drawings. The plan view depicts fins, gates and trench silicide (TS) source/drain contacts that will eventually be formed above the semiconductor substrate 105. As indicated in FIG. 1A, the views X1-X1 and X2-X2 are cross-sectional views taken through the device in a direction corresponding to a gate length direction of the device, and the view Y-Y is a cross-sectional view taken through the device in a direction corresponding to a gate width direction of the device. It should also be noted that, although some of the figures contain a plan view of the product 100, not all aspects of the processing shown in the cross-sectional views will be depicted in the plan view so as to not overly complicate the drawings.

The transistor devices formed in the product 100 depicted herein may be either NMOS or PMOS transistors, or a combination of both. Additionally, various doped regions, e.g., halo implant regions, well regions and the like, may be formed, but are not depicted in the attached drawings. The substrate 105 may have a variety of configurations, such as the depicted bulk silicon configuration. The substrate 105 may also have a silicon-on-insulator (SOI) configuration that includes a bulk silicon layer, a buried insulation layer and an active semiconductor layer, wherein semiconductor devices are formed in and above the active semiconductor layer. The substrate 105 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers.

A plurality of fins 110 were defined in the substrate 105. Gate structures 115 were positioned above the fins 110. Source/drain regions 120 of the product 100 were formed in the fins adjacent the gate structures 115. A lower portion of the fin 110 and a surface of the substrate 105 is covered by an isolation structure 125. Sidewall spacers 130 (e.g., silicon nitride) are positioned on sidewalls of the gate structures 115, and dielectric cap layers 135 are positioned above the gate structures 115. A first dielectric layer 140 (e.g., silicon dioxide, a low-k dielectric material or an ultra-low-k dielectric material) is formed between and above the gate structures 115.

In the illustrative example depicted herein, the transistor devices are FinFET devices, but the embodiments disclosed herein should not be considered to be limited to IC products that include FinFET transistor devices as the various inventions disclosed herein may be employed when manufacturing other forms of transistors, such as planar transistor devices. At the point of processing depicted in FIG. 1A, the fins 110 were formed in the substrate 105 using traditional manufacturing techniques, and the gate structures 115 were formed across the fins 110. The fins 110 were formed by performing one or more etching processes, e.g., anisotropic etching processes, through a patterned fin-formation etch mask (not shown) to form a plurality of fin-formation trenches in the substrate 105. The width and height of the fins 110 may vary depending upon the particular application. Additionally, the overall size, shape and configuration of the fin-formation trenches and fins 110 may vary depending on the particular application. Next, a layer of insulating material 125 (e.g., silicon dioxide) was then deposited so as to overfill the fin-formation trenches. A chemical mechanical polishing (CMP) process was then performed to planarize the upper surface of the layer of insulating material 125 with the upper surface of fins 110, thereby removing the patterned fin-formation hard mask. Next, a recess etching process was performed on the layer of insulating material 125 such that it has a recessed upper surface that exposes a desired amount of the fins 110 above the recessed upper surface.

After the layer of insulating material 125 was recessed, the gate structures 115 were formed above the fins 110. The sidewall spacers 130 and the cap layers 135 may include a variety of different materials, such as silicon nitride, SiNC, SiN, SiCO, SiNOC, etc. In one illustrative embodiment, the sidewall spacer 130 and the cap layer 135 may be made of the same material. Typically, the gate structures 115 are manufactured using known replacement gate manufacturing techniques, where a sacrificial gate structure (not shown) is formed above the substrate 105, along with an original cap layer (not shown) positioned above the sacrificial gate structure and used as a hard mask for forming the sacrificial gate structure. Next, prior to the formation of the final gate structures 115, epitaxially-grown (epi) semiconductor material 120 was formed on the exposed portions of the active regions (e.g., fins 110 in the case of a FinFET device), i.e., in the source/drain regions of the devices. The semiconductor material 120 may be formed to any desired thickness. However, it should be understood that the semiconductor material 120 need not be formed in all applications. Other layers of material, such as contact etch stop layers and the like, are not depicted in the drawings. The source/drain regions 120 were formed in cavities between the gate structures 115 and the sidewall spacers 130. The fin 110, the gate structure 115 and the source/drain regions 120 are elements of a transistor device.

After formation of the semiconductor material 120, a layer of insulating material 140 was blanket-deposited across the product 100. Thereafter a CMP process was performed to planarize the layer of insulating material 140 using the original gate caps (not shown) positioned above the sacrificial gate structures as a polish stop layer. At that point, an etching process was performed so as to remove the original gate caps so as to expose the upper surface of the sacrificial gate structure for removal. Then, traditional replacement gate manufacturing processes were performed to remove the sacrificial gate structures so as to define replacement gate cavities between the spacers 130 where the final gate structures 115 are formed by sequentially depositing various layers of material, such as a gate insulation layer (e.g., silicon dioxide, hafnium dioxide or some other high-k material), a barrier layer, a work function material layer and a conductive fill layer (not separately shown) into the replacement gate cavities and performing a planarization process to remove the portions of the gate materials positioned outside of the gate cavities. Thereafter, the materials for the gate structures 115 were recessed so as to make room for the cap layer 135. Then, the cap layer 135 was formed by depositing a layer of dielectric material in the space above the recessed gate materials and then performing a planarization process. Next, additional dielectric material was deposited so that the dielectric layer 140 covers top portions of the sidewall spacers 130 and the cap layers 135.

Figure 1B:
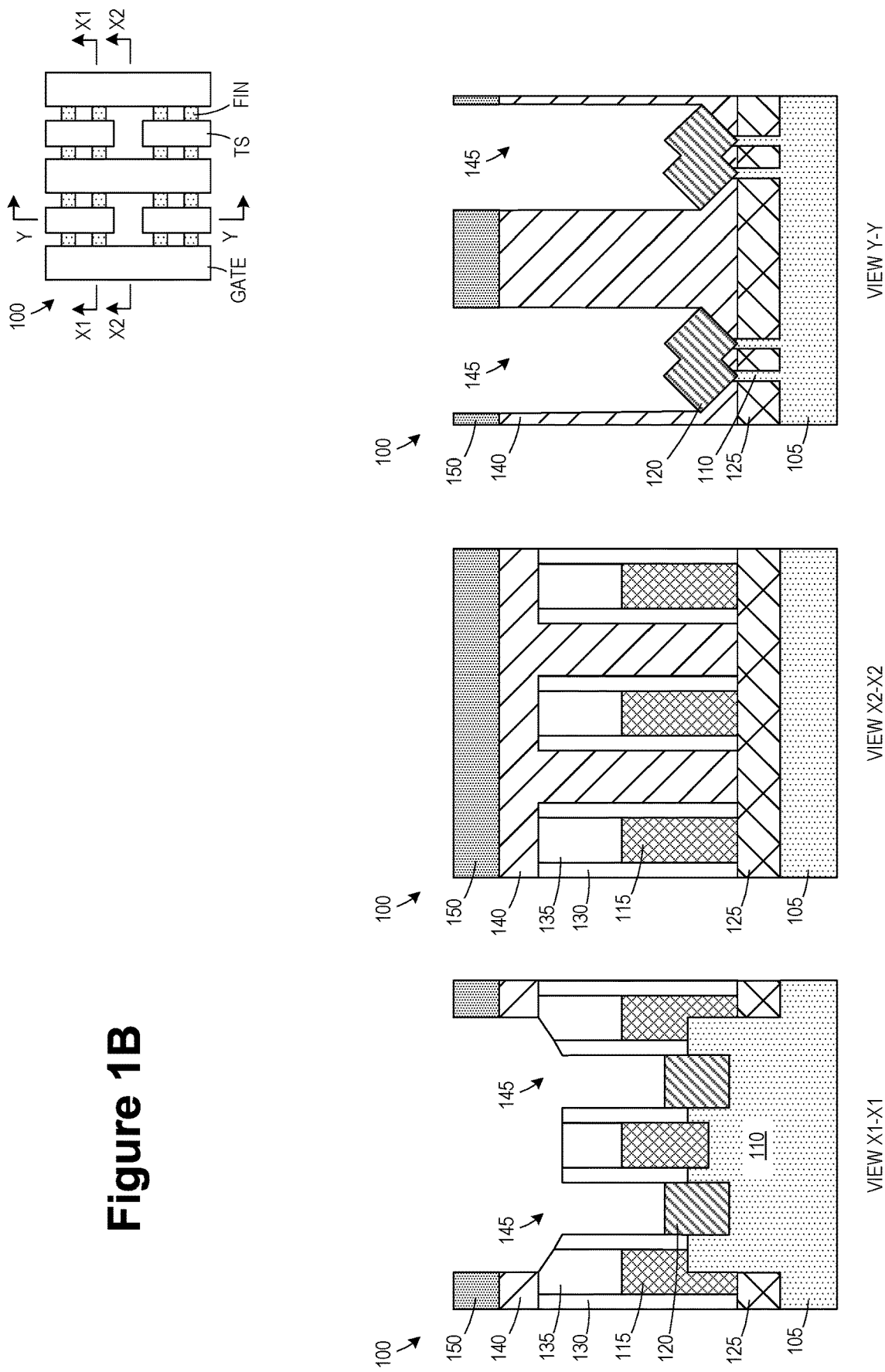

FIG. 1B illustrates the product 100 after one or more processes were performed to pattern TS cavities 145 in the dielectric layer 140. A patterning stack 150 (e.g., organic patterning layer (OPL), photoresist, BARC, etc.—not shown) was formed above the dielectric layer 140 and patterned to define openings corresponding to the TS cavities 145. An etch process was performed through the patterned openings to define the TS cavities 145.

Figure 1C:
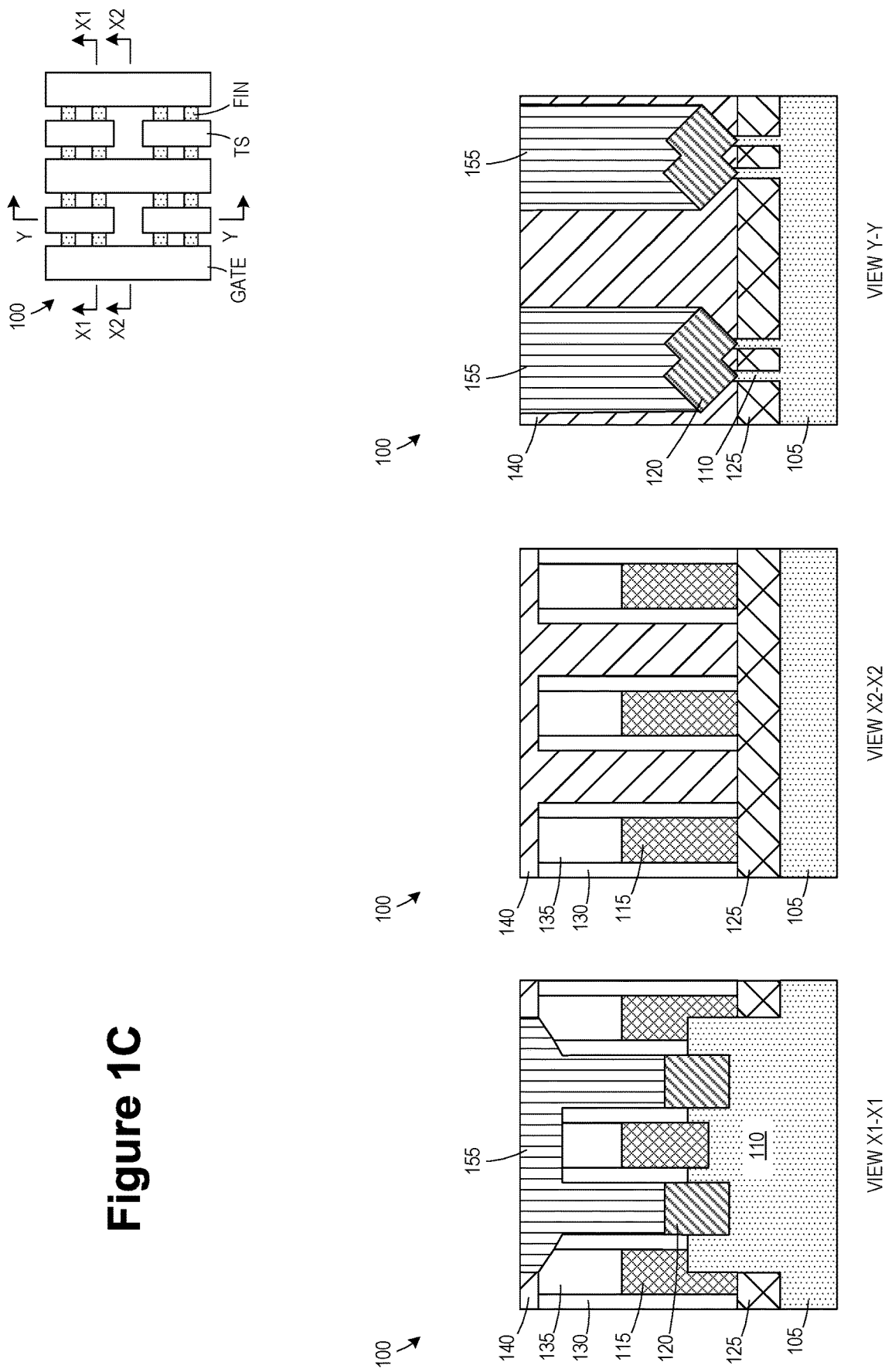

FIG. 1C illustrates the product 100 after several processes were performed to form source/drain contacts 155 (e.g., metal silicide or combination of metal silicide and metal, referred to as trench silicide (TS) contacts) in the TS cavities 145 above the epitaxial semiconductor material 120 that defines the source/drain regions. The patterning stack 150 was removed. One or more processes (e.g., cleaning, deposition, annealing, planarization, etc.) were performed to fill the TS cavities 145 with conductive silicide material to define the source/drain contacts 155. In one example, the source/drain contacts 155 are line-type structures.

Figure 1D:
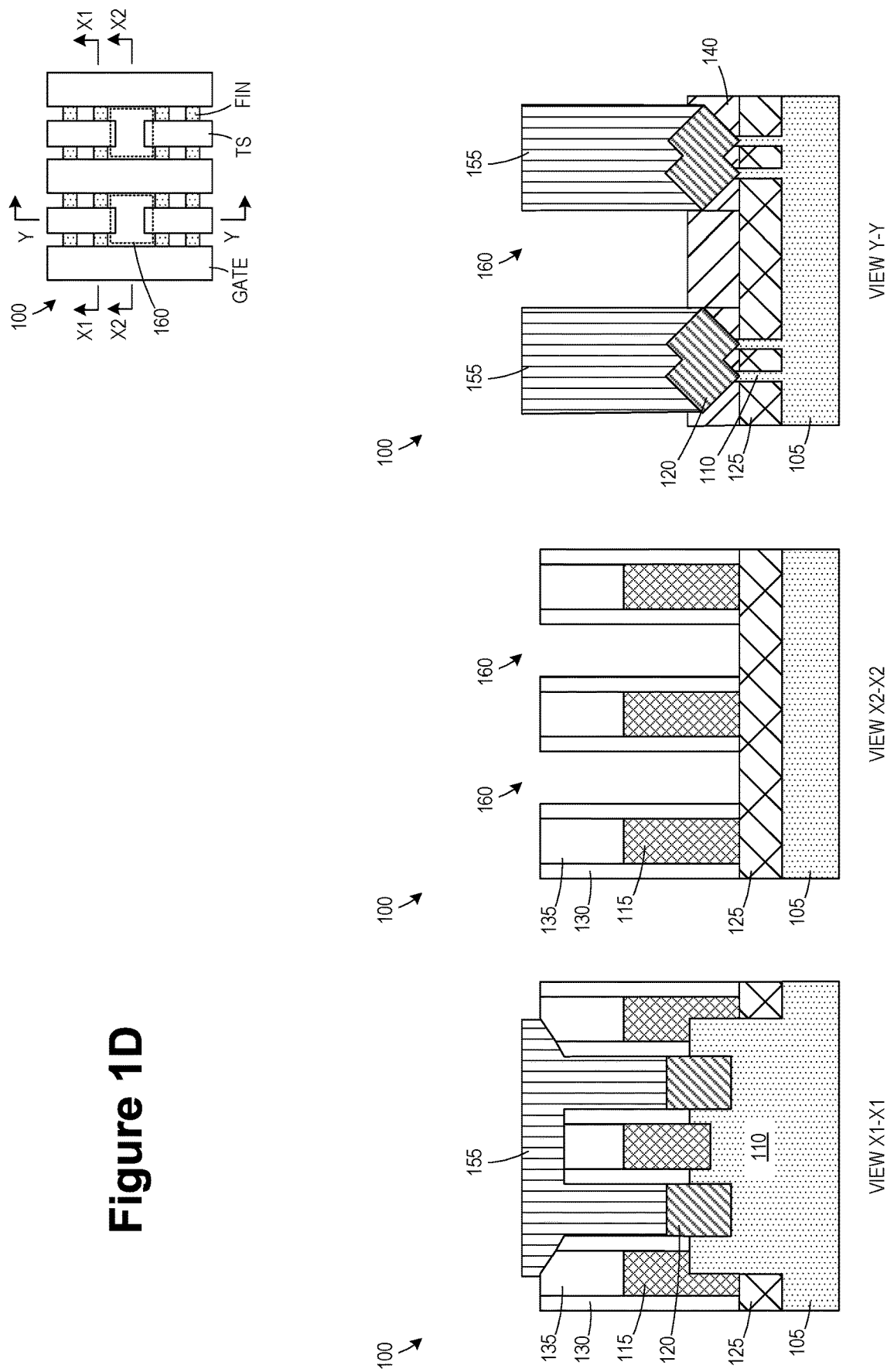

FIG. 1D illustrates the product 100 after an etch process was performed to recess the dielectric layer 140 to define air gap cavities 160. The air gap cavities 160 are shown using dashed lines in the plan view. In general, the air gap cavities 160 are positioned between tip-to-tip regions between axially aligned source/drain contacts 155. The etch process may damage top portions of the sidewall spacers 130, cap layers 135, and source/drain contacts 155.

Figure 1E:
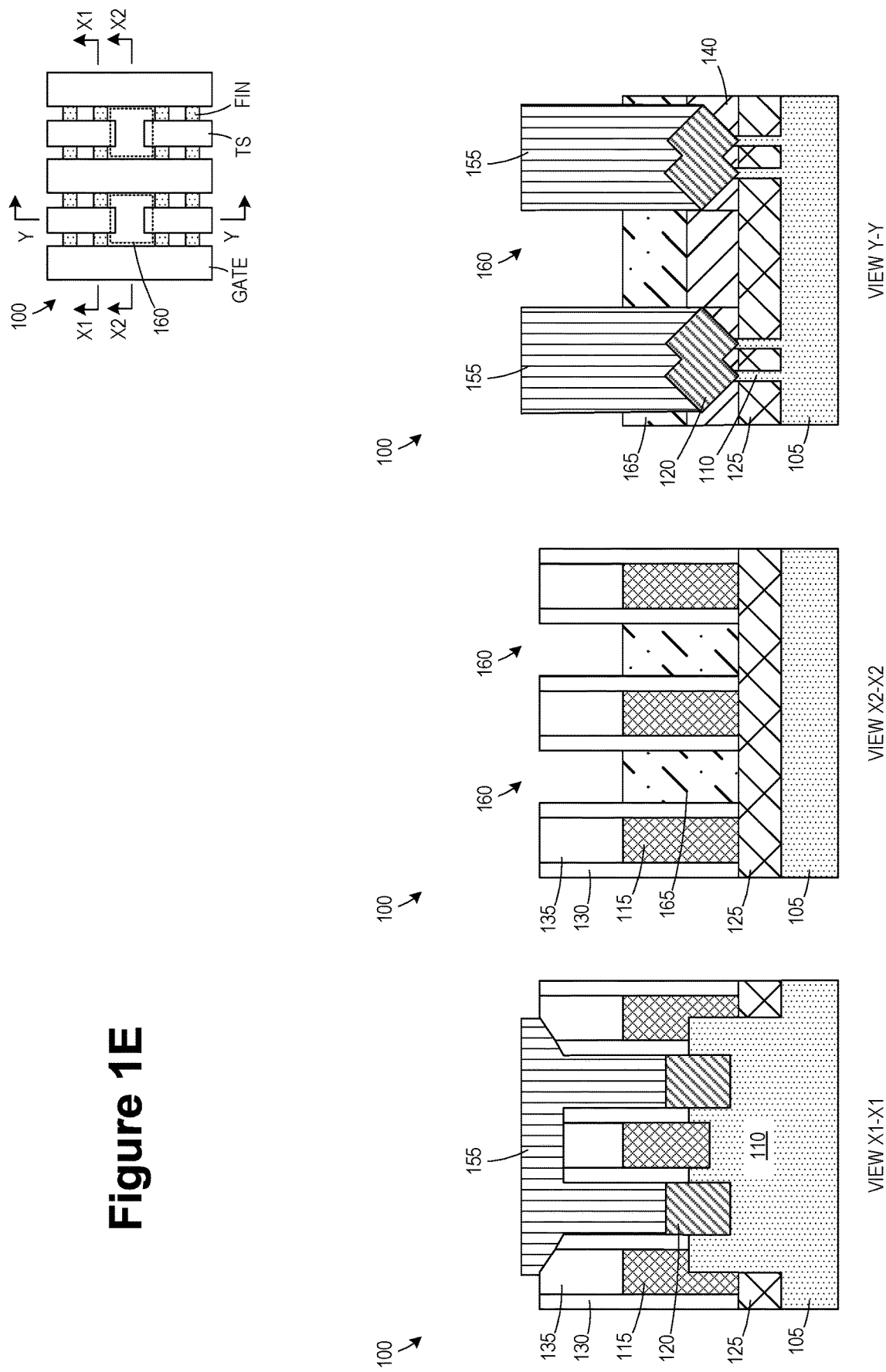

FIG. 1E illustrates the product 100 after a deposition process was performed to form a sacrificial layer 165 in the air gap cavities 160 (e.g., OPL) and an etch process was performed to recess the sacrificial layer 165. The height of the sacrificial layer 165 after the recess etch is approximately the same as the height of the gate structure 115.

Figure 1F:
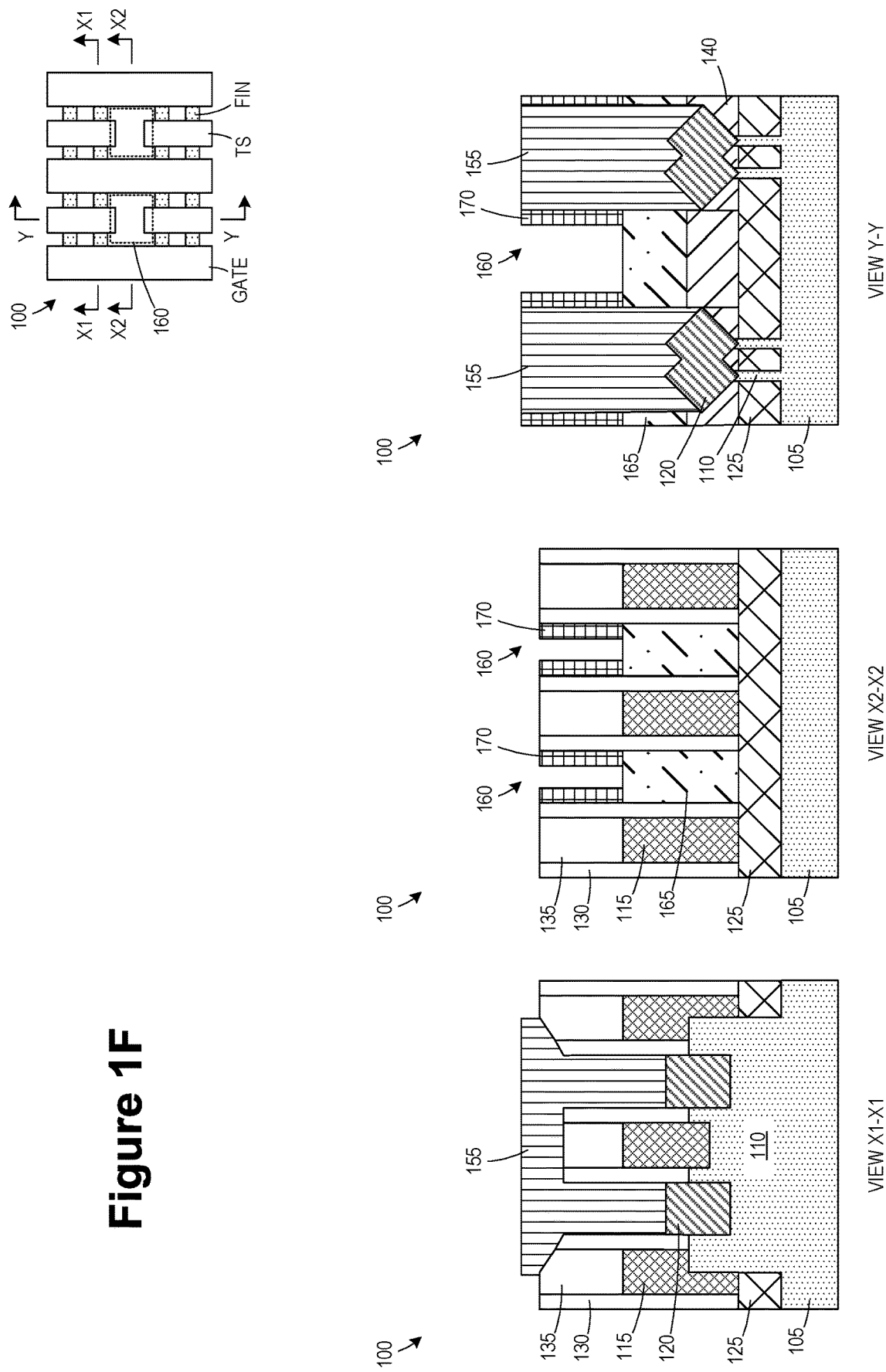

FIG. 1F depicts the product 100 after several process operations were performed to form a spacer 170 in the air gap cavities 160 above the sacrificial layer 165. A conformal layer of spacer material (e.g., SiCO, SiC, $SiO_2$) was formed and an anisotropic etch process was performed to remove the horizontal portions of the conformal layer, resulting in the formation of the spacer 170. The spacer 170 narrows the openings of the air gap cavities 160.

Figure 1G:
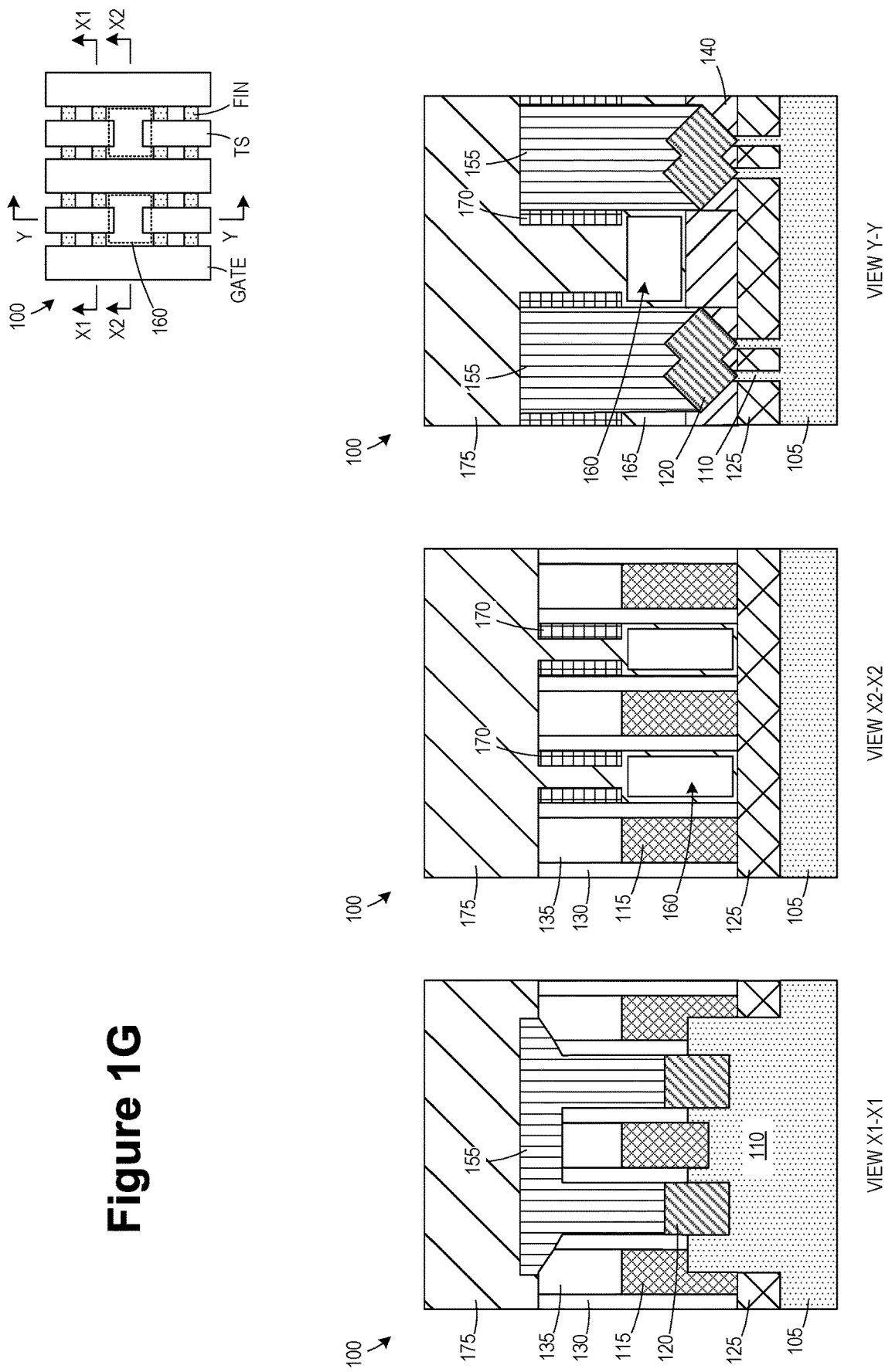

FIG. 1G illustrates the product after a strip process was performed to remove the sacrificial layer 165 and a deposition process was performed to deposit a dielectric layer 175 (e.g., SiC) that pinches off the air gap cavities 160. In some embodiments, the dielectric layer 175 lines the air gap cavities 160.

Figure 1H:
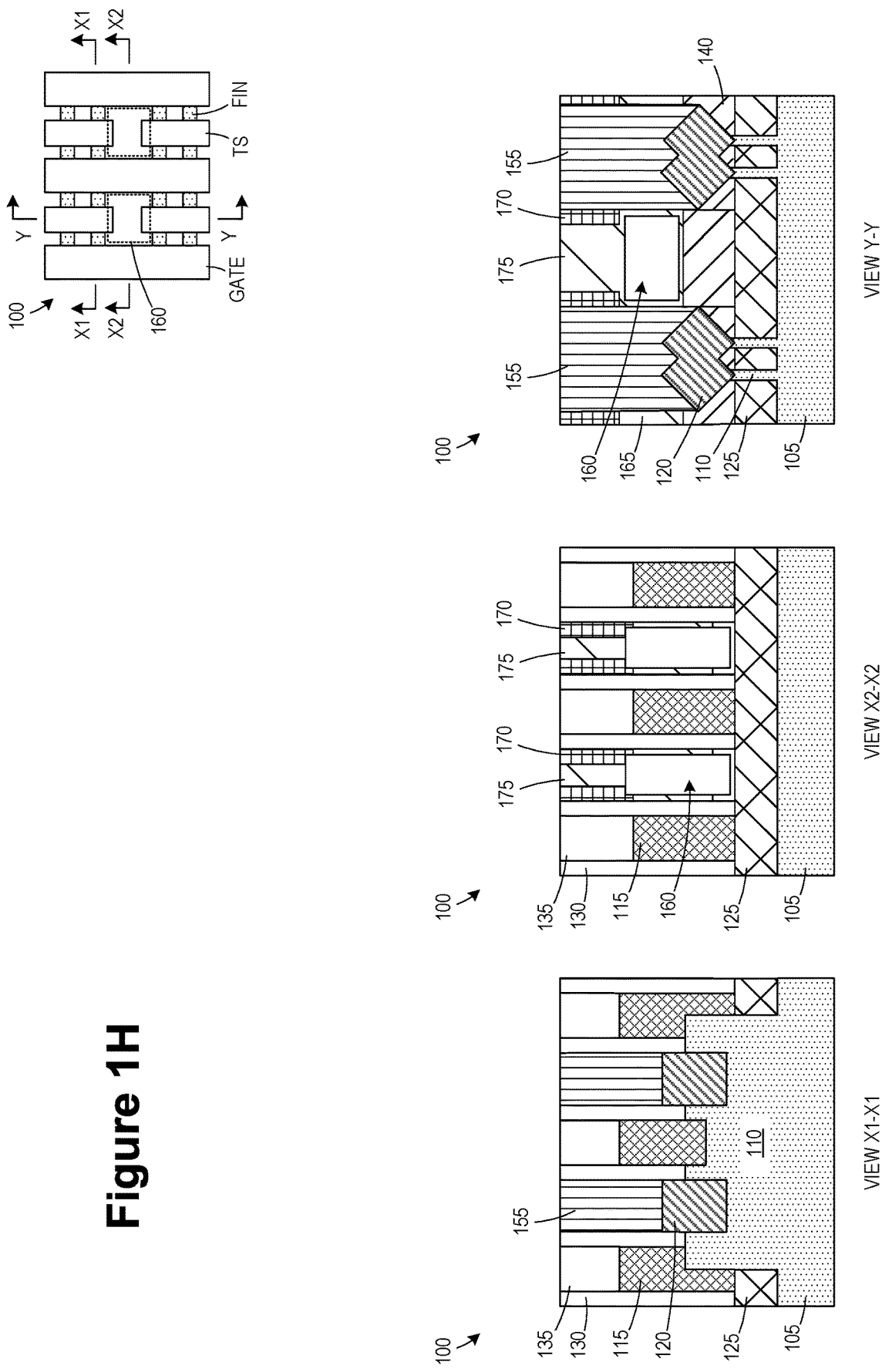

FIG. 1H illustrates the product 100 after a CMP process was performed to remove excess portions of the dielectric layer 175 extending outside the air gap cavities 160. The CMP process also removes portions of the source/drain contacts 155 extending outside the TS cavities 145 and to remove portions of the sidewall spacers 130 and cap layer 135 (i.e., that may have been damaged during the etch process of FIG. 1D).

FIG. 1I illustrates the product 100 after several processes were performed. A deposition process was performed to form a second dielectric layer 180 (e.g., silicon dioxide, a low-k dielectric material or an ultra-low-k dielectric material) above the gate structures 115. A patterned etch process was performed to define contact cavities (e.g., CA cavities), and one or more processes (e.g., deposition and planarization) were performed to form conductive contacts 185 (e.g., tungsten or some other conductive metal or materials). Due to the etch selectivity provided by the spacer 170 and the dielectric material 175 compared to the dielectric layer 180, if the contact cavities are misaligned, the material between the source/drain contacts 155 is not damaged during the etching of the dielectric layer 180.

The particular embodiments disclosed above are illustrative only, as the embodiments may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the embodiments. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   first and second active regions;
   a first source/drain contact positioned above the first active region;
   a second source/drain contact positioned above the second active region, wherein the first source/drain contact is axially aligned with the second source/drain contact in a gate width direction of the device parallel to axial lengths of the first source/drain contact and the second source/drain contact, and a tip-to-toe region is defined between a first end of the first source/drain contact and second end of the second source/drain contact, wherein the first source/drain contact and the second source/drain contact each has a width less than the axial length, wherein the axial lengths and the widths are taken in a horizontal cross section; and a dielectric material disposed between the first and second source/drain contacts, wherein the dielectric material defines an air gap cavity positioned between the first and second source/drain contacts in the tip-to-toe region.

2. The device of claim 1, wherein the dielectric material lines the air gap cavity.

3. The device of claim 1, further comprising first and second gate structures formed above the first and second active regions adjacent the first and second source/drain contacts, wherein the air gap cavity extends from the first gate structure to the second gate structure in the tip-to-tip region.

4. The device of claim 3, wherein the first and second source/drain contacts are positioned between the first and second gate structures.

5. The device of claim 1, wherein the first and second active regions comprise first and second fins of semiconductor material.

6. The device of claim 1, further comprising a dielectric spacer positioned on upper sidewall portions of the first and second source/drain contacts, wherein the dielectric material is positioned adjacent the dielectric spacer to seal a top opening of the air gap cavity.

7. The device of claim 6, wherein the dielectric material lines the air gap cavity.

8. The device of claim 6, further comprising:
a dielectric layer positioned above the first and second source/drain contacts; and
a conductive contact embedded in the dielectric layer and contacting the first source/drain contact, wherein the conductive contact overlaps a portion of the dielectric spacer.

9. A device, comprising:
first and second active regions;
first and second gate structures formed above the first and second active regions;
a first source/drain contact positioned above the first active region between the first and second gate structures;
a second source/drain contact positioned above the second active region between the first and second gate structures, wherein the first source/drain contact is axially aligned with the second source/drain contact in a gate width direction of the device parallel to axial lengths of the first source/drain contact and the second source/drain contact, and a tip-to-toe region is defined between a first end of the first source/drain contact and second end of the second source/drain contact, wherein the first source/drain contact and the second source/drain contact each has a width less than the axial length, wherein the axial lengths and the widths are taken in a horizontal cross section; and
a dielectric material disposed between the first and second source/drain contacts, wherein the dielectric material defines an air gap cavity positioned between the first and second source/drain contacts in the tip-to-toe region and extends from the first gate structure to the second gate structure in the tip-to-tip region.

10. The device of claim 9, wherein the dielectric material lines the air gap cavity.

11. The device of claim 9, further comprising a dielectric spacer positioned on upper sidewall portions of the first and second source/drain contacts, wherein the dielectric material is positioned adjacent the dielectric spacer to seal a top opening of the air gap cavity.

12. A method, comprising:
forming first and second active regions in a semiconductor substrate;
forming a first source/drain contact positioned above the first active region;
forming a second source/drain contact positioned above the second active region, wherein the first source/drain contact is axially aligned with the second source/drain contact in a gate width direction of the device parallel to axial lengths of the first source/drain contact and the second source/drain contact, and a tip-to-toe region is defined between a first end of the first source/drain contact and second end of the second source/drain contact, wherein the first source/drain contact and the second source/drain contact each has a width less than the axial length, wherein the axial lengths and the widths are taken in a horizontal cross section; and
forming a dielectric material between the first and second source/drain contacts, wherein the dielectric material defines an air gap cavity positioned between the first and second source/drain contacts in the tip-to-toe region.

13. The method of claim 12, further comprising:
forming a plurality of gate structures above the first and second active regions;
forming a first dielectric layer between the plurality of gate structures;
removing first portions of the first dielectric layer to form first and second contact cavities in the first dielectric layer between the first and second gate structures;
forming the first and second source/drain contacts in the first and second contact cavities, respectively; and
removing a second portion of the first dielectric layer between the first and second source/drain contacts to define the air gap cavity.

14. The method of claim 13, further comprising:
forming a sacrificial layer in a lower portion of the air gap cavity;
forming a dielectric spacer positioned on upper sidewall portions of the first and second source/drain contacts in the air gap cavity above the sacrificial layer;
removing the sacrificial layer; and
forming the dielectric material adjacent the dielectric spacer to seal a top opening of the air gap cavity.

15. The method of claim 14, further comprising:
forming a second dielectric layer above the first and second source/drain contacts; and
forming a conductive contact embedded in the second dielectric layer and contacting the first source/drain contact, wherein the conductive contact overlaps a portion of the dielectric spacer.

16. The method of claim 15, wherein the dielectric material lines the air gap cavity.

17. The method of claim 13, wherein the air gap cavity is defined between the first and second gate structures.

18. The method of claim 17, wherein the first and second source/drain contacts are axially aligned between the first and second gate structures.

19. The method of claim 12, wherein the first and second active regions comprise first and second fins of semiconductor material.

\* \* \* \* \*